INVENTOR
ALVIN M. GOODMAN

BY [signature]

ATTORNEY

ELECTROLUMINESCENT DEVICE AND METHOD OF OPERATING

Filed Sept. 25, 1967 2 Sheets-Sheet 2

INVENTOR
ALVIN M. GOODMAN

BY [signature]
ATTORNEY

United States Patent Office 3,492,548
Patented Jan. 27, 1970

3,492,548

ELECTROLUMINESCENT DEVICE AND METHOD OF OPERATING

Alvin M. Goodman, Princeton, N.J., assignor to RCA Corporation, a corporation of Delaware Filed Sept. 25, 1967, Ser. No. 670,144
Int. Cl. H01l *11/00, 15/00*
U.S. Cl. 317—235 14 Claims

ABSTRACT OF THE DISCLOSURE

A field effect electroluminescent device comprised of (1) a semiconductor body having a portion with a single conductivity type, (2) means for producing in the layer a region depleted of majority carriers including an insulated field effect electrode on the semiconductor, (3) a majority-carrier injector, and (4) a minority-carrier injector on the semiconductor. In the method, a region of the semiconductor body is depleted of majority carriers. Then, majority carriers are injected into an undepleted region of the semiconductor via the majority carrier injector, and minority carriers are injected directly into the depleted region of the semiconductor via the minority carrier injector, which is located within the depletion region. When the density of injected minority carriers is sufficiently large, the conductivity type of the depleted region becomes inverted and a p-n junction is created in the semiconductor. Recombination of electron-hole pairs in the vicinity of this junction results in the emission of light.

BACKGROUND OF THE INVENTION

This invention relates to an improved method of creating injection electroluminescence and to a novel device employing this method. Injection electroluminescent devices are known in the art. A relatively efficient injection electroluminescent device configuration is that of the p-n junction in a semiconductor material. In this device, light is emitted due to radiative recombination, across the junction, of electron-hole pairs. Such a device commonly employs a III–V semiconductor compound and emits in the red and infrared portion of the spectrum. In order to obtain emission at shorter wavelengths, it is preferable to use a material having a wider energy bandgap than the III–V compounds employed heretofore. Attention has been turned to the II–VI semiconductor compounds which are known to luminesce in the visible region of the spectrum and generally have wider energy bandgaps than the III–V compounds formed from the elements in the same rows of the period table. However, it has been difficult to fabricate p-n homo-junctions in these materials by any of the known chemical techniques. In addition, many prior art injection electroluminescent devices are inefficient due to the predominance of majority carrier extraction from the semiconductor material as compared to minority carrier injection. Another reason for inefficiency of many prior art devices is that recombination of electron-hole pairs occurs very close to a semiconductor-minority carrier injection contact interface. This results in much of the recombination taking place through non-radiative transitions.

SUMMARY OF THE INVENTION

In general, a novel electroluminescent device is comprised of a semiconductor body having a portion with a single conductivity type and means for producing, in this portion, a region depleted of majority carriers. The device also includes means for supplying majority carriers to an undepleted region of the single conductivity type portion of the semiconductor, and means for injecting a sufficient density of minority carriers into the depleted region so as to invert the conductivity type of at least a portion of this depleted region. In this way, both types of carriers are made available in the body such that radiative recombination of minority and majority carriers will occur in the vicinity of a junction formed at the interface of the inverted region and the undepleted region of the semiconductor. Also included in the device is a means for conducting the light, produced by this recombination, out of said device. The novel device may be termed a field effect electroluminescent device.

The method for producing luminescence in a semiconductor body having a single conductivity type comprises the steps of (1) producing in the body a region depleted of majority carriers, (2) injecting majority carriers into an undepleted region of the body, and (3) injecting a sufficient density of minority carriers directly into the depleted region of the body to invert the conductivity type of the depleted region and to cause radiative recombination of the injected carriers.

One advantage of the novel electroluminescent device is that a p-n junction does not have to be formed chemically in the semiconductor material. Another advantage is that nonradiative recombination of electron-hole pairs in surface states at a minority carrier-semiconductor interface will be substantially reduced, thereby resulting in a more efficient device.

DESCRIPTION OF PREFERRED EMBODIMENTS

Example 1

Figure 1A:
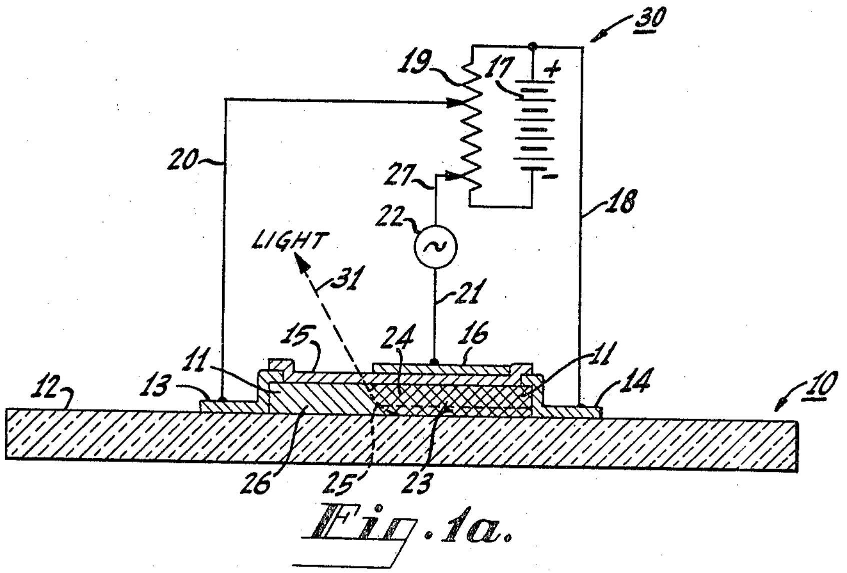
FIGURE 1*a* is a sectional view of a novel electro-luminescent device embodying the invention including a schematic diagram of a circuit for operating the device.
Figure 1B:
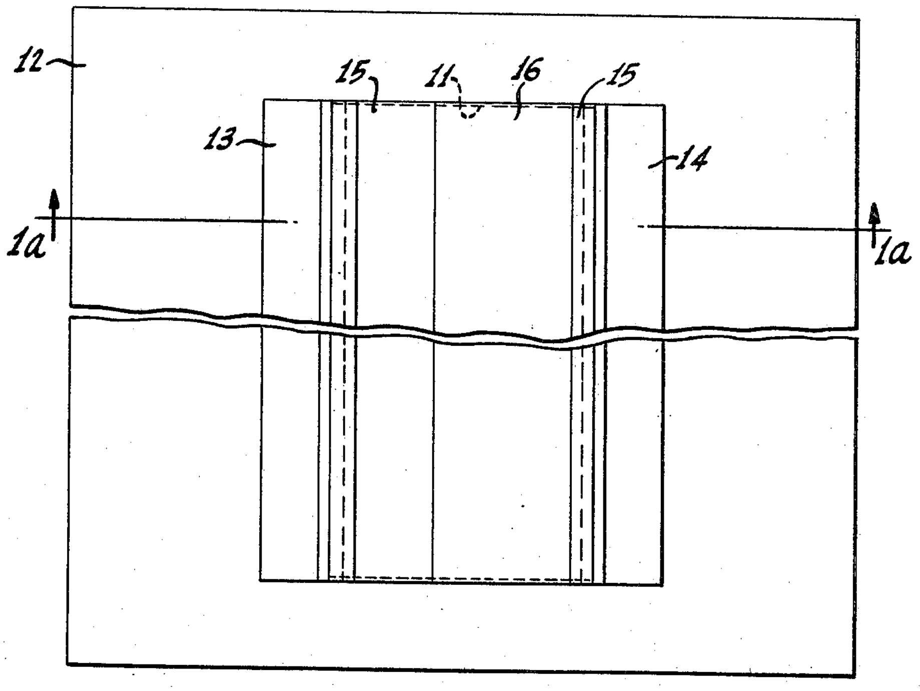
FIGURE 1*b* is a top plan view of the embodiment shown in FIGURE 1.

Referring to FIGURE 1*a*, an electroluminescent field effect device 10 comprises a layer 11 of a semiconductor material disposed on a glass substrate 12. The semiconductor is of a single conductivity type and may have either n-type or p-type conductivity. The particular semiconductor material of this example is n-type zinc selenide having a trap density of less than or about $10^{14}$ traps per cubic centimeter and an electron density of about $10^{15}$ electrons per cubic centimeter. The thickness of the layer 11 is about 1 micron and the width of the layer 11 is about 17 microns. The layer 11 can be any desired length. A majority carrier injection contact 13, which in this example is of indium metal, and serves as an electron injection contact is formed on the substrate 12 contiguous with one edge of the semiconductor layer 11 and overlapping about 1 micron of the edge. The electron injection contact 13 extends in a direction along the length of the semiconductor layer 11. A minority carrier injection contact 14, which in this example is of platinum metal and serves as a hole injection contact, is disposed on the substrate 12 contiguous with and overlapping the edge of the semiconductor layer 11 opposite the electron injection contact 13. The length of overlap of the hole injection contact 14 on the semiconductor layer 11 is also about 1 micron. A silicon dioxide insulator 15 is disposed on, and along the length of, the semiconductor layer 11. The insulator 15, in addition, covers that portion of the injection contacts 13 and 14 which overlap the semiconductor layer 11. A field effect electrode 16 is disposed on a portion of the insulator 15 and along the length thereof, so as to be adjacent to the hole injection contact 14 and spaced from the electron injection contact 13. The separation between the electron injection contact 13 and the hole injection contact 14 is about 15 microns. The field effect electrode 16 is separated from the hole injection contact 14 by the thickness of the insulator 15. This thickness is about 1200 A. The distance between the field effect electrode 16 and the electron injection contact 13 is about 5 microns.

The device 10 may be operated in conjunction with the circuit 30 shown in FIGURE 1*a*. In the circuit, the positive terminal of a DC voltage source 17 is connected by a first conductive lead 18 to the hole injection contact 14. In parallel with the voltage source 17 is a multitap resistor 19. A second conductive lead 20 connects the electron injection contact 13 with one tap on the resistor 19. The field effect electrode 16 is connected to another tap of the multitap resistor 19 through the series connection consisting of conductive lead 21, AC modulation voltage source 22, and conductive lead 27. The connections to the resistor 19 are made such that the field effect electrode 16 is more negatively biased than the electron injection contact 13.

In the operation of the device 10, the zinc selenide semiconductor layer 11 is depleted of electrons in the region 23 under the gate electrode by applying a voltage of about 12 volts to the field effect electrode 16. This region is hereinafter referred to as the depletion region. The remaining portion of the semiconductor layer is termed an undepleted region 26. Minority carriers are injected directly into the depletion region 23 by applying a positive voltage to the hole injection contact 14. Upon application of this voltage, holes are injected to a density so as to invert the conductivity type of a portion of the depletion region 23. The region where the conductivity type is so inverted is hereinafter termed the inversion region 24. A p-n junction 25 is thereby formed between the inversion region 24 and the undepleted region 26 of the semiconductor layer 11. Electrons are injected into the undepleted region 26 through the electron injection contact 13 by applying a negative voltage to the electron injection contact 13. As indicated in FIGURE 1*a*, light is emitted from the semiconductor in the vicinity of the electrically formed p-n junction 25. Since the carrier density is highest adjacent the insulator 15, most of this light is generated in the junction adjacent the insulator 15 as shown by the arrow 31. The light emerges from the device through the insulator 15. The insulator 15 is transmitting to the light emitted by the device 10. The vicinity of the p-n junction from which the light is emitted may be termed the active portion of the semiconductor layer 11. All other portions of the semiconductor being termed inactive portions. The active portion extends a distance, from the p-n junction, equal to a minority carrier diffusion length into the undepleted region 26 of the semiconductor layer 11 and a distance of a majority carrier diffusion length into the inversion region 24 of the semiconductor layer 11.

In order to improve the efficiency of the device, it is desirable that the dimensions of the inactive portions of the semiconductor be made as small as possible since the resistance of these portions cause the absorption of power and the development of unwanted heat in the device. Another technique for improving the efficiency of the novel device is to reduce the resistance of the inactive portions by maximizing the carrier mobility of the semiconductor. The carrier mobility can often be increased by altering the fabrication technique by which the semiconductor layer is made and by increasing the thickness of the semiconductor layer. However, the optimum thickness may be determined by other considerations hereinafter discussed.

The voltage difference between the field-effect electrode 16 and the hole-injection contact 14 controls the rate of minority carrier injection into the depletion region 23 of the semiconductor 11. The voltage difference between the field effect electrode 16 and the electron injection contact 13 controls the rate of majority carrier injection into the undepleted region 26 of the semiconductor layer 11. These rates of injection affect the light output of the device since the light output is a direct function of the number of carrier pairs available for recombination. The light output may be modulated by applying a modulating signal to any of the three conducting leads connected to the device. The modulation voltage source 22, shown in FIGURE 1*a*, varies the voltage applied to the field-effect electrode 16 thereby causing a change in the light output of the device. Alternatively one can modulate the light output of the device by modulating the voltage applied to either of the carrier injection contacts 13 and 14.

The voltages applied at each of the carrier injection contacts 13 and 14 and that applied at the field-effect electrode 16 are such that an inversion layer and a p-n junction are produced in the semiconductor. The particular voltages necessary to achieve an inversion layer will depend upon the particular insulator, the thickness of the insulator, the particular semiconductor material and the thickness of the semiconductor layer. The light output of the device will vary directly with the current passing through the device. Hence, for any given device an increase in the current (that is, an increase in carrier density) will cause an increase in the light output. The voltage difference required between the majority injection contact and the minority injection contact for producing any given light level will therefore be the sum of (1) the voltage drop at each of the carrier injection contacts, (2) the voltage drop in the inactive portions of both the undepleted and depleted regions 26 and 23 respectively of the semiconductor, and (3) the voltage across the junction which is necessary to produce injection of minority carriers in either or both directions within the active region.

For greatest efficiency the depletion region 23 and preferably the inverted region 24 of the semiconductor layer 11 should extend through the body of the semiconductor such that recombination of electron-hole pairs will occur substantially in the vicinity of the p-n junction 25 formed in the semiconductor layer 11.

This can be accomplished in one of two ways. In one embodiment the thickness of the semiconductor layer 11 is made thin enough so that the depletion region 23 and the inversion region 24 extend completely through the thickness of the semiconductor layer 11 at at least one point thereof. Alternatively, the minority carrier injection contact 14 is positioned in such close proximity to the field effect electrode 16 that the inversion region 24 entirely surrounds that portion of the minority carrier injection contact 14 which is in direct contact with the semiconductor layer 11. In these ways no low resistance path for majority carriers exists between the majority carrier injection contact 13 and the minority carrier injection contact 14, and recombination of electron-hole pairs will occur predominantly in the active region of the semiconductor.

The maximum thickness of a depletion layer can be estimated with the aid of the following formula:

$$L_d=\left[\frac{2(\xi g-2\zeta)\epsilon}{Ne^2}\right]^{1/2}$$

where $L_d$ is the depletion layer depth in meters;

$\mathcal{E}g$ is the energy bandgap of the semiconductor in electron volts;

$\zeta$ is the energy difference between the Fermi level and the conduction band of the bulk semiconductor in electron volts;

$\epsilon$ is the dielectric constant of the semiconductor in farads per meter;

N is the net donor doping of the semiconductor in reciprocal cubic meters; and $e$ is the charge of an electron in coulombs.

When the thickness of the semiconductor is said to be less than a depletion layer thickness, it is meant that it is less than the maximum estimated thickness for a specific semiconductor with a voltage, above that necessary to create the maximum depletion layer thickness, applied thereto.

In all cases, the interface formed by the minority carrier injection contact 14 and the semiconductor layer 11 must be within a depletion region. Any semiconductor layer capable of emitting light due to the recombination of electron-hole pairs across an electrically-induced junction therein may be used in the novel device. Examples of semiconductors useful in the practice of this invention include, but are not limited to, zinc oxide, zinc sulfide, zinc telluride, cadmium oxide, cadmium sulfide, cadmium selenide and cadmium telluride.

It is preferred that the majority carrier injection contact 13 and the minority carrier injection contact 14 be ohmic for majority carriers and minority carriers, respectively. As used herein, an ohmic contact is one which is conductive in both directions. Although ohmic contacts are preferred, the minority carrier injector may be tunnel injecting or thermionic injecting. By thermionic injecting it is meant that carriers are injected into the semiconductor over a potential energy barrier. It is also possible to obtain minority carriers by avalanche ionization of hole-electron pairs in the semiconductor adjacent the minority carrier contact.

The preferred contact material for electron injection is a low work function material such as cesium, barium, magnesium, indium, thallium, gallium, aluminum, calcium, or strontium. The preferred contact material for hole injection is a high work function material such as platinum, palladium nickel, iridium, rhenium, arsenic, tellurium or selenium.

The insulator material should be a high resistivity material which is blocking to the flow of carriers in either direction. The insulator 15 can be, for example, a material having an energy bandgap higher than that of the semiconductor or it can be an organic insulator. Materials such as silicon dioxide, silicon monoxide, silicon nitride, strontium titanate, barium titanate and calcium titanate are particularly suitable as the insulator material in the novel device. For practical operation this insulator should be less than about 2 microns thick and is preferably less than one micron thick. If a larger thickness is used, higher voltages must be applied to the field effect electrode 16 in order to achieve the same light output.

The field effect electrode 16 may be any electrically conductive material which does not detrimentally interact with the insulator 15. Examples of suitable field effect electrode materials are metals such as gold and aluminum or a highly doped semiconductor such as highly doped degenerate silicon.

In order to maximize the amount of light derived from the device, it is desirable to maximize the optical transmission to radiation emitted in the semiconductor layer 11. This can be done in any of several ways, depending upon the direction at which the device will be observed. If one observes the output through the substrate 12, the substrate should be transparent to the emitted light and the semiconductor layer should be as thin as possible while still maintaining efficient operation. If one oberves the light output through the insulator 15, it is preferable that the insulator be transparent to the light. Also, it may be advantageous to use a transparent field effect electrode such as a tin oxide electrode. Another technique for maximizing the light output in the latter case is by having an active region such that a substantial part thereof is not directly under the field effect electrode. This can be done by using a semiconductor having a low density of majority carriers and by inverting the depletion layer with a high density of minority carriers.

Example 2

Figure 2:
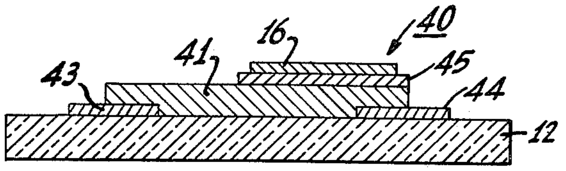
FIGURE 2 is a sectional view of another electroluminescent device embodying the invention wherein the minority and majority carrier injecting means are on a face of the semiconductor body opposite a field effect electrode.

In the embodiment of the novel device 40 shown in FIGURE 2, a majority carrier injection contact 43 and a minority carrier injection contact 44 are disposed on the substrate 12 in a spaced relationship. A semiconductor layer 41 is disposed on the substrate 12 in the space between the carrier injection contact 43 and 44 and overlapping a portion of these contacts. A gate insulator 45, on the semiconductor layer 41, extends from the edge of the semiconductor layer 41 nearest the minority carrier injection contact 44 into the portion opposite the space between the contacts 43 and 44. The field effect electrode 16, on the insulator 15 overlaps the minority carrier injection contact 44 and the space between the carrier injection contacts 43 and 44. In this configuration, it is desirable that the thickness of the semiconductor layer 41, at least in the region between the insulator 45 and the minority carrier injection contact 44, be less than a depletion layer thickness and preferably be less than an inversion layer thickness.

Figure 3:
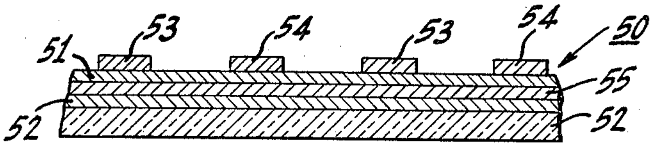
FIGURES 3 and 4 are sectional views of multiple arrays of electroluminescent cells embodying the invention which are capable of being produced by thin film techniques.
Figure 4:
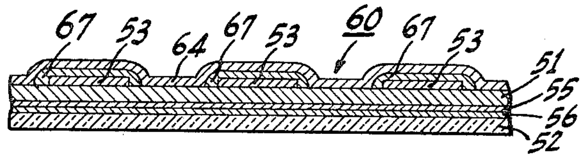

A plurality of electroluminescent field effect cells can be deposited as an array on a single insulating substrate as illustrated in FIGURES 3 and 4. Such a device can be made by thin film fabrication techniques known in the art and is applicable to the assembly of large area arrays such as a display panel.

Example 3

According to the embodiment 50 of FIGURE 3, a plurality of parallel strips of transparent field effect electrodes, such as transparent conductive tin oxide strips, is disposed on the transparent insulating substrate 52, such as glass or fused quartz. A continuous transparent field effect insulator layer lies over the field effect electrode strips 56 and the uncovered portion of the substrate 52. The field effect insulator 55 can be fabricated, for example, from silicon nitride. A continuous extrinsic semiconductor layer 51 is disposed on the field effect insulator layer 55. The embodiment 50 includes majority carrier injection strips and minority carrier injection strips on the semiconductor layer 51 in a direction perpendicular to the field effect electrode strips 56. These carrier injection strips 53 and 54 are arranged alternately and spaced from each other.

Example 4

A device 60 as shown in FIGURE 4 has a structure similar to the embodiment 50 of FIGURE 3. The device 60 includes the support 52, the field effect electrode 56 on the support 52, the insulator 55 on the electrode 56, the semiconductor layer 51 on the insulator 55 and a plurality of parallel majority carrier electrode strips 53 disposed on the semiconductor layer 51 in a direction perpendicular to the field effect electrode strips 56. The device 60 also includes a plurality of insulating strips 67 which are coextensive with and surround the outer surfaces of the majority carrier injection strips 53. A minority carrier injection contact 64 in the form of a continuous layer covers the insulating strips 67 and is in contact with the semiconductor layer 51 in the regions between the insulating strips 67. The majority carrier injection contacts 53 are thereby insulated from the minority carrier contact 64 by means of the insulating strips 67.

The semiconductor area in the array shown in FIGURE 3 which is to emit light is selected by applying the correct potentials to a desired set of adjacent carrier injection contact strips 53 and 54 and a desired field effect electrode strip 56. The semiconductor area between the particular carrier injection contact strips and above the particular gate electrode so selected will luminesce.

In the device 60 shown in FIGURE 4 the minority carrier injection contact 64 is a continuous layer which may be continuously biased. The selection and modulation of the semiconductor area to emit light in this configuration is made by applying the proper potentials to the desired majority carrier contact 52 and gate electrode strip 56.

Example 5

Figure 5:
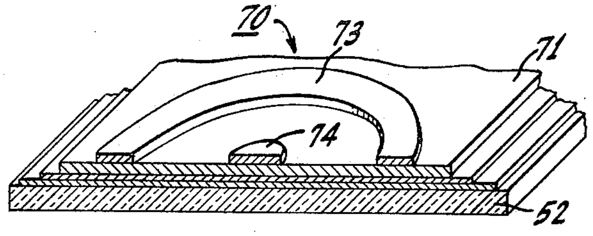
FIGURE 5 is a sectional view of an embodiment wherein the carrier injection means has a circular geometry.

In addition to the rectilinear geometries of electrode shape described above, it is also possible to use other geometries. For example, FIGURE 5 shows a device 70 having a ring geometry wherein one carrier injection contact (here a majority carrier injection contact 73) is in the form of a ring on the surface of a semiconductor layer 71. The other carrier injection contact (here a minority carrier injection contact 74) is then positioned within the ring. This type of geometry will give rise to a ring-shaped light output which may be suitable for large area displays or other display applications.

Example 6

Figure 6:
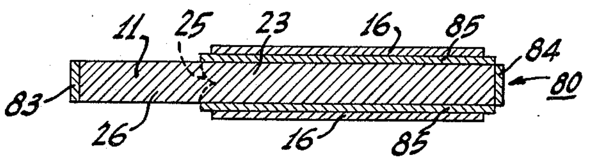
FIGURES 6 and 7 are sectional views of other embodiments of the invention illustrating alternative electrode arrangements.

A single electroluminescent cell 80 having a double field plate configuration is shown in FIGURE 6. In this embodiment a majority carrier injection contact 83 and a minority carrier injection contact 84 are disposed along opposite edges of a semiconductor layer 81. A field effect insulator 85 is disposed along a portion of the upper and lower surfaces of the semiconductor layer 81 starting from the edge nearest the minority carrier injection contact 84 and terminating in a middle region of the semiconductor layer 81. Field effect electrodes 86 lie over the insulator 85 so as to cover most of the insulator 85.

In this four-terminal configuration, smaller gate voltages are required for a given semiconductor, insulator and semiconductor and insulator thickness than in the single field plate, three terminal, electroluminescent cells previously disclosed. Here, recombination would tend to take place deeper within the semiconductor rather than closer to the surface thereof as with other embodiments of the novel device. It would therefore be preferable in the device 80 to have a thin transparent semiconductor layer to gain maximum efficiency of light leaving the device. For example, a semiconducting zinc oxide layer of less than one micron is suitable.

Example 7

Figure 7:
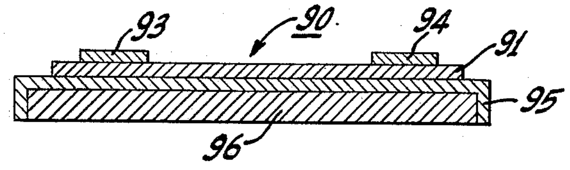

FIGURE 7 shows an embodiment 90 comprising a field effect electrode 96 consisting of a heavily-doped n-type silicon wafer and a thermally-grown silicon dioxide insulator 95 covering one surface and the edges of the field effect electrode 96. An n-type cadmium sulfide semiconductor layer 91 is disposed on the insulator 95. A platinum contact 94 for hole injection and an ohmic indium contact 93 for electron injection are on the semiconductor layer 91 and spaced from each other.

What is claimed is:

1. An electroluminescent device comprising:
(1) a semiconductor body having a portion with a single conductivity type,
(2) insulated gate means for producing in said portion a region depleted of majority carriers,
(3) bias means of a particular polarity for injecting majority carriers into an undepleted region of said portion,
(4) bias means of opposite polarity for injecting minority carriers into said depleted region to invert the conductivity type of said depleted region whereby radiative recombination of said minority and majority carriers may occur in said portion, and means for transmitting light produced by said recombination out of said device.

2. An electroluminescent field effect cell comprising:
(a) a body consisting of a normally single conductivity type semiconductor material,
(b) a field effect electrode closely spaced from said body by an insulator, and field effect electrode bias means of a first polarity for creating a depletion region in said semiconductor body,
(c) bias means of opposite polarity for injecting minority carriers into said body, said minority carrier injection being within said depletion region, and
(d) bias means of said first polarity for injecting majority carriers into a region of said semiconductor body lying outside said depletion region whereby, upon the injection of a sufficient density of minority carriers, said depletion region becomes inverted in conductivity type and radiative recombination occurs between minority carriers injected into said depletion region and majority carriers injected outside said depletion region.

3. An electroluminescent field effect cell comprising:
(a) a layer of single conductivity type semiconductor material,
(b) a minority carrier injector and a majority carrier injector on said layer, said injectors being spaced from each other,
(c) an insulated field effect electrode proximate to said minority carrier injector such that said minority carrier injector contacts a region of said layer completely within a depletion region when bias voltages are applied to said cell and wherein said majority carrier injector contacts a region of said layer outside said depletion region, at least a portion of said insulated field effect electrode extending over a region of said semiconductor layer between said spaced carrier injectors,
(d) field effect bias means of a first polarity for creating said depletion region,
(e) majority carrier injector bias means of said first polarity for injecting majority carriers into an undepleted region of said semiconductor layer, and
(f) minority carrier injector bias means of a polarity opposite said first polarity for inverting the conductivity type of said depleted region by injecting minority carriers therein and to create a p-n junction in said semiconductor layer to cause electroluminescence therein.

4. An electroluminescent field effect device comprising:
(a) an insulating base,
(b) at least one layer of a semiconductor material on said base, said semiconductor material, in the absence of biasing means, being of one conductivity type,
(c) at least one minority carrier injector in contact with said semiconductor layer,
(d) at least one majority carrier injector in contact with said semiconductor layer and spaced from said one minority carrier injector,
(e) at least one insulator covering at least a portion of said semiconductor layer in the region between said spaced carrier injectors,
(f) at least one field effect electrode on said insulator positioned adjacent said minority carrier injector such that said injector is within a depletion region formed when a bias voltage is applied to said field effect electrode, said field effect electrode extending over the region of said layer between said spaced carrier injectors, said field effect electrode being offset with respect to its position relative to said spaced carrier injectors, the semiconductor layer under said field effect electrode having a thickness of less than a maximum depletion length determined by operating voltages applied to said device,
(g) field effect electrode biasing means for forming a depletion region in said semiconductor layer,
(h) majority carrier injector biasing means for causing injection of majority carriers into an undepleted region of said semiconductor layer, (i) minority carrier injector biasing means for injecting minority carriers into said depleted region and inverting the conductivity type of said region with respect to its original conductivity type to create a p-n junction in said semiconductor layer.

5. The electroluminescent device described in claim 4 wherein the semiconductor material is selected from the II–VI compounds.

6. The electroluminescent device described in claim 4 wherein the carrier injectors are disposed on opposite surfaces of said semiconductor layer.

7. The electroluminescent device described in claim 4 wherein the carrier injectors are disposed on the same surface of said semiconductor layer.

8. The electroluminescent device recited in claim 4 wherein said majority carrier injector is ohmic for majority carriers.

9. The electroluminescent device recited in claim 4 wherein both the majority carrier injector and the minority carrier injector make ohmic contact with the semiconductor layer for injection of their respective carriers.

10. The electroluminescent device of claim 4 including signal voltage means for modulating the light output of said device.

11. A method for producing luminescence in a semiconductor body having a single conductivity type comprising the steps of:

(a) producing in said body a region depleted of majority carriers, (b) injecting majority carriers into an undepleted region of said body, and (c) injecting a sufficient density of minority carriers directly into said depleted region of said body to invert the conductivity type of said depleted region whereby radiative recombination occurs between said injected minority carriers with said injected majority carriers.

12. A method of producing luminescence in a field effect cell of the type comprised of a semiconductor layer of single conductivity type, means for injecting majority carriers into said layer, means for injecting minority carriers into said layer and an insulated field effect electrode on said layer, said layer under said insulated field effect electrode having a thickness of less than the thickness of a depletion layer in said semiconductor layer, including the steps of:

(a) depleting said semiconductor layer of majority carriers in the region under said insulated field effect electrode, (b) injecting minority carriers into said depleted region so as to invert the conductivity of the semiconductor constituting said depleted region and to form a p-n junction in said semiconductor layer, and (c) injecting majority carriers into an undepleted region of said semiconductor layer whereby radiative recombination of minority and majority carriers occurs in the vicinity of said p-n junction.

13. The method described in claim 10 including the step of applying a modulating voltage to said cell.

14. The electroluminescent field effect cell described in claim 3 wherein said semiconductor layer under said insulated field effect electrode has a thickness of less than the maximum thickness of said depletion region.

References Cited

UNITED STATES PATENTS

| | | | |
|---|---|---|---|
| 3,400,383 | 9/1968 | Meadows | 340—173 |
| 3,398,311 | 8/1968 | Page | 313—108 |
| 3,385,731 | 5/1968 | Weimer | 117—212 |

JAMES D. KALLAM, Primary Examiner

MARTIN H. EDLOW, Assistant Examiner

U.S. Cl. X.R

148—1.5; 313—108; 317—234